US006849372B2

(12) United States Patent
Ray et al.

(10) Patent No.: US 6,849,372 B2
(45) Date of Patent: Feb. 1, 2005

(54) METHOD OF MANUFACTURING IMAGING COMPOSITIONS

(75) Inventors: Kevin Ray, Fort Collins, CO (US); Anthony Paul Kitson, Evans, CO (US); Jian Bing Huang, Trumball, CT (US)

(73) Assignee: Kodak Polychrome Graphics, Norwalk, CT (US)

(*) Notice: Subject to any disclaimer, the term of this patent is extended or adjusted under 35 U.S.C. 154(b) by 183 days.

(21) Appl. No.: 10/208,553

(22) Filed: Jul. 30, 2002

(65) Prior Publication Data

US 2004/0023166 A1 Feb. 5, 2004

(51) Int. Cl.[7] .......................... G03F 7/023; G03F 7/30

(52) U.S. Cl. ...................... 430/168; 430/166; 430/189; 430/190; 430/191; 430/192; 430/193; 430/302

(58) Field of Search .............................. 430/168, 166, 430/189, 190, 191, 192, 193, 302, 326, 328, 327, 330

(56) References Cited

U.S. PATENT DOCUMENTS 4,259,434 A 3/1981 Yamasue et al. ............ 430/302
4,452,880 A 6/1984 Seino et al. ................ 430/309
4,544,627 A 10/1985 Takahashi et al. .......... 430/325
4,708,925 A 11/1987 Newman .................... 430/270
4,973,572 A 11/1990 DeBoer ...................... 503/227
5,141,838 A 8/1992 Aoshima et al. ............ 430/191
5,143,816 A 9/1992 Mizutani et al. ............ 430/192
5,244,771 A 9/1993 Jandrue, Sr. et al. ....... 430/221
5,401,618 A 3/1995 Chapman et al. ........... 430/330
5,529,891 A 6/1996 Wang et al. ................ 430/523
5,536,619 A 7/1996 Verburgh ................. 430/273.1
5,609,994 A 3/1997 Lee ........................... 430/323
5,609,995 A 3/1997 Akram et al. ............... 430/327
5,631,119 A * 5/1997 Shinozaki ................... 430/326
5,705,308 A 1/1998 West et al. ................. 430/165
5,705,322 A 1/1998 West et al. ................. 430/325
5,731,127 A 3/1998 Ishizuka et al. ......... 430/270.1
5,851,735 A 12/1998 Miller et al. ................ 430/322
5,858,604 A 1/1999 Takeda et al. .............. 430/162
5,919,600 A 7/1999 Huang et al. ............ 430/272.1
5,998,102 A 12/1999 Eckler ........................ 430/325
6,004,728 A 12/1999 Deroover et al. ........... 430/302
6,022,667 A 2/2000 Vermeersch et al. ..... 430/271.1
6,060,217 A 5/2000 Nguyen et al. ............. 430/302
6,060,222 A 5/2000 West et al. ................. 430/326
6,066,434 A 5/2000 Blanchet-Fincher et al. ....................... 430/273.1
6,074,802 A 6/2000 Murata et al. ............. 430/270
6,083,662 A 7/2000 Miller et al. ............. 430/271.1
6,090,532 A 7/2000 West et al. ................. 430/326
6,096,481 A 8/2000 Vermeersch et al. ........ 430/302
6,143,479 A 11/2000 Fiebag et al. ............... 430/331
6,153,353 A 11/2000 Van Damme et al. ...... 430/270
6,168,897 B1 1/2001 Ushirogouchi et al. ..... 430/139
6,182,570 B1 2/2001 Rorke et al. ................ 101/462
6,186,067 B1 2/2001 Rorke et al. ................ 101/467
6,294,311 B1 9/2001 Shimazu et al. ......... 430/271.1
6,352,811 B1 3/2002 Patel et al. .............. 430/270.1
6,352,812 B1 3/2002 Shimazu et al. ......... 430/273.1
6,358,669 B1 3/2002 Savariar-Hauck et al. ....................... 430/273.1
2004/0023160 A1 2/2004 Ray et al. ................... 430/302

FOREIGN PATENT DOCUMENTS

| | | |
|---|---|---|
| DE | 44 11 176 | 10/1994 |
| EP | 0 708 372 | 4/1996 |
| EP | 0 732 628 | 9/1996 |
| EP | 0 823 327 | 1/1998 |
| EP | 0 864 420 | 9/1998 |
| EP | 0 908 305 | 4/1999 |
| EP | 0 908 307 | 4/1999 |
| EP | 0 908 784 | 4/1999 |
| EP | 0 909 657 | 4/1999 |
| EP | 0 940 266 | 9/1999 |
| EP | 0 950 518 | 10/1999 |
| EP | 0 960 728 | 12/1999 |
| EP | 1 023 994 | 8/2000 |
| GB | 1 245 924 | 2/1972 |
| GB | 2 276 729 | 10/1994 |
| JP | 2001042509 | 2/2001 |
| JP | 2001042510 | 2/2001 |

OTHER PUBLICATIONS

Dammel, "Diazonaphthoquinone–based Resists," Tutorial Text, vol. TT 11, pp. 104–106.

* cited by examiner

*Primary Examiner*—John S. Chu
(74) *Attorney, Agent, or Firm*—Faegre & Benson LLP

(57) ABSTRACT

The present invention provides methods of forming and using thermally imageable composite elements which may be developed into lithographic printing plates. More specifically, the present invention provides a method of forming thermally imageable composite elements which provide substantial developer resistance in desired regions, while maintaining white light desensitivity and durability.

29 Claims, No Drawings

METHOD OF MANUFACTURING IMAGING COMPOSITIONS

BACKGROUND OF THE INVENTION

The art of lithographic printing is based on the immiscibility of oil and water. Lithographic printing plates have ink receptive areas generated on a hydrophilic surface. When the surface is moistened with water and ink is applied, the hydrophilic surface retains the water and repels the ink, and the ink receptive areas accept the ink and repel the water. The ink may then be transferred to the surface of a material upon which the image is to be reproduced. Typically, the ink is first transferred to an intermediate blanket, which in turn transfers the ink to the surface of the material upon which the image is to be reproduced.

Lithographic printing plates typically comprise a radiation-sensitive coating applied over the hydrophilic surface of a substrate. After a portion of the coating is exposed to radiation (commonly referred to as image-wise exposure), the exposed portion becomes either more soluble or insoluble in a developer than an unexposed portion of the coating. A printing plate is generally considered a positive-working plate if, after exposure to radiation, the exposed regions of the radiation-sensitive coating become more soluble and are removed in the developing process revealing the hydrophilic surface. Conversely, if the exposed regions become more insoluble in the developer and the unexposed regions are removed in the developing process, the plate is considered a negative-working plate. In each instance, the undeveloped areas provide an ink-receptive image, while the regions of the hydrophilic surface exposed during development repel ink.

Traditional positive-working printing plates are sensitive to ultraviolet radiation and have excellent developer resistance prior to image-wise exposure. Thermally sensitive (i.e. IR sensitive) positive-working printing plates have also been developed. One drawback to these thermally sensitive printing plates are that they have just-adequate developer resistance prior to imaging. One method of improving developer resistance in thermally imageable systems is to add solubility inhibitors to the radiation-sensitive layer. The solubility inhibiting component may be a separate compound or be part of the material composing the radiation-sensitive layer. After image-wise thermal exposure of the radiation-sensitive layer (including a solubility inhibitor), the rate of dissolution of the exposed areas in a developer is substantially greater than the rate of dissolution of the unexposed regions. In this manner, the exposed regions may be removed by the developer, while the unexposed regions produce a developer-resistant image.

Materials including quinonediazides are suitable solubility inhibitors. Materials including quinonediazides provide improved plate resolution, aging characteristics and developer resistance, while maintaining a desired imaging speed. However, one drawback to printing plates incorporating quinonediazides is that the plate suffers from increased white light sensitivity, causing the quinonediazides to decompose when subjected to white light. This produces an extremely developer soluble plate in which portions of the plate that are not thermally image-wise exposed may be undesirably developed.

SUMMARY OF THE INVENTION

In one embodiment, the present invention provides a method of forming a white light desensitized, thermally imageable composite element. The thermally imageable composite element includes a substrate, a first layer and a second layer. The substrate includes a hydrophilic surface. The first layer is soluble in an aqueous alkaline developer and is applied on to the hydrophilic surface. The second layer, which is insoluble in the aqueous alkaline developer and includes a polymeric material, a quinonediazide and a base, is applied on to the first layer. The composite element is then exposed to ultraviolet light and heat treated. After the element is thermally image-wise exposed, thermally imaged portions of the second layer have a substantially greater solubility in the aqueous alkaline solution than thermally unimaged portions of the second layer.

In another embodiment, the present invention provides a method of forming a white light desensitized, thermally imaged composite element. A thermally imageable element having a substrate, a first layer soluble in an aqueous alkaline solution, and a second layer insoluble in an aqueous alkaline solution and including a polymeric material, a quinonediazide and a base is provided. After the composite element is exposed to UV light and heat treated, the composite element is thermally image-wise exposed to increase the solubility of thermally imaged portions of the second layer in the aqueous alkaline solution relative to thermally unimaged portions of the second layer.

In yet another embodiment, the present invention provides a method of forming a white light desensitized, developer-resistant image on a thermally imageable composite element. A thermally imageable composite element, including a substrate, a developer soluble first layer and a developer insoluble second layer is provided. After the element is exposed to ultraviolet light and heat treated, the composite element is thermally image-wise exposed to substantially increase the solubility of thermally imaged portions of the second layer relative to thermally unimaged portions of the second layer in an aqueous alkaline developer. The element is then developed with aqueous alkaline solution to form a developer-resistant image. The resulting imaged composite element may possess improved printing characteristics, including enhanced white light desensitivity and durability.

In a further embodiment, the present invention provides a method for providing a white light desensitized composite element to a customer. A thermally imageable element as described herein is exposed to UV light and heat treated. The composite element is then image-wise exposed to thermal radiation to substantially increase the solubility of thermally imaged portions of the second layer relative to thermally unimaged portions of the second layer in an aqueous alkaline solution. The element is then developed in the aqueous alkaline solution to form a developer-resistant image. The element may be delivered to a customer during or after any step of the method, and the method may then be completed the customer to provide a lithographic printing plate. Thus, in this embodiment, the invention is a part of the production and delivery cycle of a lithographic printing plate.

In yet a further embodiment, the present invention provides a method of making a white light desensitized lithographic printing plate. A thermally imageable composite element is provided, which includes a substrate having a hydrophilic surface, a first layer applied to the substrate which is soluble in an aqueous alkaline solution, and a second layer applied to the first layer and including a polymeric material, an effective amount of a quinonediazide to provide the second layer with substantial insolubility in an aqueous alkaline solution and a base. The composite element is exposed to ultraviolet light and heat treated, and then the element is thermally image-wise exposed to substantially increase the solubility of thermally imaged portions of the second layer in the aqueous alkaline solution relative to thermally unimaged portions of the second layer. The composite element is then developed with the aqueous alkaline solution to form an developer-resistant image suitable for use in lithographic printing applications.

As used herein, the phrase "composite element" refers to a substrate having one or more layers deposited on to the substrate. "Thermally imageable composite element" refers to a composite element that is sensitive to thermal radiation. "Thermally image-wise expose" refers to placing a pattern or mask embodying a desired image over the composite element and exposing a selected portion of the element to thermal radiation. "Thermally imaged composite element" refers to a composite element that has been thermally-image-wise exposed. "Developer-resistant image" refers to an image produced on an imaged composite element by developing the element in a solution.

DETAILED DESCRIPTION OF THE INVENTION

The present invention provides methods of making and using thermally imageable composite elements with improved developer resistance while maintaining white light desensitivity. The thermally imageable composite element includes a substrate having a hydrophilic surface, a first layer soluble in an aqueous alkaline developer, and a second layer that is substantially insoluble in the aqueous alkaline developer, and that includes a polymeric material, a quinonediazide moiety and a base.

The substrate used in the present invention includes a support, and may also include coating and/or adhesion layers to provide a hydrophilic surface. Examples of suitable substrate supports include metals, polymeric films, ceramics, stiff papers, or a laminate of these materials. Suitable metal supports include aluminum, zinc, titanium and alloys thereof. In one embodiment, the substrate includes aluminum, which may be treated by graining and anodizing and may then be conditioned to produce a hydrophilic surface. Suitable polymeric supports, such as polyethylene terephthalate film, may be coated with hydrophilicity-enhancing components, including alkoxysilanes, aminopropyltriethoxysilane, glycidoxypropyltriethoxysilane and epoxy functional polymers, as well as conventional coating materials used on polyester bases in photographic films. The substrate may be of sufficient thickness to sustain the wear from printing and be thin enough to wrap around a printing form, typically from about 100 to about 600 $\mu$m.

The substrate may also include an interlayer between the support and the first layer. The interlayer may be formed by treatment of the support with, for example, silicate, dextrine, hexaflourosilicic acid, phosphate/flouride, polyvinyl phosphonic acid (PVPA) or polyvinyl phosphonic acid copolymers.

The first layer is composed of one or more components that are generally soluble in an aqueous alkaline solution, but insoluble in solvents used to apply the second layer, so that the second layer may be coated over the first layer without dissolving the first layer.

The first layer may include a first polymeric material. Polymeric materials suitable for use as the first polymeric material include polymers that contain an acid and/or phenolic functionality, and mixtures of such materials. Useful polymeric materials include carboxy functional acrylics, vinyl acetate/crotonate/vinyl neodecanoate copolymers, styrene maleic anhydride copolymers, phenolic resins, maleated wood rosin, and combinations thereof. First layers that provide resistance both to fountain solution and aggressive washes are disclosed in Shimazu, U.S. Pat. No. 6,294,311, incorporated herein by reference.

Other useful polymeric materials are copolymers that comprise N-substituted maleimides, particularly N-phenylmaleimide; polyvinylacetals; methacrylamides; and acrylic and/or methacrylic acid. Two or three functional groups may be present in the polymeric material. Suitable polymeric materials of this type are copolymers of N-phenylmaleimide, methacrylamide, and methacrylic acid, more specifically those that contain about 25 to about 75 mol %, more specifically about 35 to about 60 mol % of N-phenylmaleimide; about 10 to about 50 mol %, more specifically about 15 to about 40 mol % of methacrylamide; and about 5 to about 30 mol %, more specifically about 10 to about 30 mol % of methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid.

These polymeric materials may be soluble in alkaline developers. In addition, they may be soluble in a methyl lactate/methanol/dioxolane (15:42.5:42.5 wt %) mixture, which may be used as a coating solvent for the first layer. However, they are generally poorly soluble in solvents such as acetone, which may be used as a solvent to coat the second layer on top of the first layer without dissolving the first layer. These polymeric materials are typically resistant to washes with 80 wt % diacetone alcohol/20 wt % water.

Another group of polymeric materials for the first polymeric material include alkaline developer soluble copolymers that include a monomer that has a urea bond in its side chain (i.e., a pendent urea group), such as disclosed in Ishizuka, U.S. Pat. No. 5,731,127. These copolymers include about 10 to 80 wt %, more particularly about 20 to 80 wt %, of one of more monomers represented by the general formula:

$$[CH_2{=}C(R){-}CO_2{-}X{-}NH{-}CO{-}NH{-}Y{-}Z],$$

in which R is —H or —$CH_3$. X is a bivalent linking group, such as a substituted or unsubstituted alkylene group, substituted or unsubstituted phenylene [$C_6H_4$] group, or substituted or unsubstituted naphthalene [$C_{10}H_6$] group. In one embodiment, X is —$(CH_2)_n$—, in which n is 2 to 8. In another embodiment, X is unsubstituted and n is 2 or 3. In yet another embodiment X is —$(CH_2CH_2)$—. Y is a substituted or unsubstituted bivalent aromatic group, such as a substituted or unsubstituted phenylene group or substituted or unsubstituted naphthalene group, such as 1,2-, 1,3-, and 1,4-phenylene; and 1,4-, 2,7-, and 1,8-naphthalene. In one embodiment, Y is unsubstituted, for example unsubstituted 1,4-phenylene. Z is —OH, —COOH, or —$SO_2NH_2$. In a particular embodiment, a suitable monomer is:

$$[CH_2{=}C(CH_3){-}CO_2{-}CH_2CH_2{-}NH{-}CO{-}NH\text{-p-}C_6H_4\text{-}Z],$$

in which Z is —OH, —COOH, or —$SO_2NH_2$.

In the synthesis of a copolymer, one or more of the urea group containing monomers may be used. The copolymers also include about 20 to 90 wt % other polymerizable monomers, such as maleimide, acrylic acid, methacrylic acid, acrylic esters, methacrylic esters, acrylonitrile, methacrylonitrile, acrylamides, and methacrylamides. A copolymer that includes in excess of 60 mol % and not more than 90 mol % of acrylonitrile and/or methacrylonitrile in addition to acrylamide and/or methacrylamide provides beneficial characteristics. The alkaline soluble copolymers may include 30 to 70 wt % urea group containing monomer; 20 to 60 wt % acrylonitrile or methacrylonitrile; and 5 to 25 wt % acrylamide or methacrylamide. These polymeric materials are typically resistant to washes with 80 wt % 2-butoxyethanol/20 wt % water.

The polymeric materials described above are also soluble in alkaline developers. In addition, they are soluble in polar solvents, such as ethylene glycol monomethyl ether, which may be used as the coating solvent for the first layer. However, they are poorly soluble in less polar solvents, such as 2-butanone (methyl ethyl ketone), which can be used as a solvent to coat the second layer over the first layer without dissolving the first layer.

Both of these groups of polymeric materials may be prepared by known methods, such as free radical polymerization. Synthesis of copolymers that have urea bonds in their side chains is disclosed, for example, in Ishizuka, U.S. Pat. No. 5,731,127.

Other alkaline developer soluble polymeric materials may be useful in the first layer. Derivatives of methyl vinyl ether/maleic anhydride copolymers that contain an N-substituted cyclic imide moiety and derivatives of styrene/maleic anhydride copolymers that contain an N-substituted cyclic imide moiety may be useful if they have the desired solubility characteristics. These copolymers may be prepared by reaction of the maleic anhydride copolymer with an amine, such as p-aminobenzenesulfonamide, or p-aminophenol, followed by ring closure by acid.

Another group of polymeric materials that may be useful in the first layer include alkaline developer soluble copolymers that include about 10 to 90 mol % of a sulfonamide monomer unit, especially those that include N-(p-aminosulfonylphenyl)methacrylamide, N-(m-aminosulfonylphenyl)methacrylamide N-(o-aminosulfonylphenyl)methacrylamide, and/or the corresponding acrylamide. Useful alkaline developer soluble polymeric materials that include a pendent sulfonamide group, their method of preparation, and monomers useful for their preparation, are disclosed in Aoshima, U.S. Pat. No. 5,141,838. Other useful polymeric materials include (1) the sulfonamide monomer unit, especially N-(p-aminosulfonylphenyl)methacrylamide; (2) acrylonitrile and/or methacrylonitrile; and (3) methyl methacrylate and/or methyl acrylate. These polymeric materials are typically resistant to washes with 80 wt % 2-butoxyethanol/20 wt % water.

Combinations of alkaline developer soluble polymeric materials may be used in the first layer to provide improved chemical resistance, i.e., resistance to both fountain solution and to aggressive washes. A combination of a polymeric material that is resistant to 80 wt % diacetone alcohol/20 wt % water with a polymeric material that is resistant to 80 wt % 2-butoxyethanol/20 wt % water, produces a layer that shows suitable resistance to both solvent mixtures. The additional polymeric material has a one-minute soak loss of less than about 20% in 80 wt % diacetone alcohol/20 wt % water, and the additional polymeric material has a one-minute soak loss of less than about 20% in 80 wt % 2-butoxyethanol/20 wt % water. One-minute soak loss is measured by coating a layer of the polymeric material on a substrate, typically at a coating weight of about 1.5 $g/m^2$, soaking the coated substrate in the appropriate solvent for one minute at room temperature, drying the coated substrate, and measuring the weight loss as a percent of the total weight of polymeric material present on the substrate.

The ability of an first layer to withstand both fountain solution and aggressive washes can be estimated by a chemical resistance parameter (CRP), defined as follows:

$$CRP=[(100-a)(100-b)]/10^4$$

in which:

a is the one minute % soak loss in 80 wt % diacetone alcohol/20 wt % water; and b is the one minute % soak loss in 80 wt % 2-butoxyethanol/20 wt % water.

In one embodiment, the chemical resistance parameter may be greater than about 0.4. In other embodiments, the chemical parameter may be greater than about 0.5 or alternatively, about 0.6. In certain embodiments, a chemical resistance parameter of at least about 0.65 may be obtained. In one embodiment, the one-minute soak loss in each solvent may be less than about 60%. In other embodiments, one-minute soak loss may be less than about 40%, or alternatively, less than about 35%.

A combination of (1) a copolymer that includes N-substituted maleimides, for example N-phenylmaleimide; methacrylamides; and acrylic and/or methacrylic acid, such as methacrylic acid with (2) an alkaline soluble copolymer that includes a urea in its side chain or with an alkaline soluble copolymer that comprises 10 to 90 mol % of a sulfonamide monomer unit, for example one that includes N-(p-aminosulfonylphenyl)methacrylamide, N-(m-aminosulfonylphenyl)methacrylamide N-(o-aminosulfonylphenyl)methacrylamide, and/or the corresponding acrylamide, is suitable. One or more other polymeric materials, such as Novolac resins, may also be present in the combination.

When a combination of polymeric materials is used, the first layer typically comprises about 10% to about 90% by weight of the polymeric material that is resistant to 80 wt % diacetone alcohol/20 wt % water, and about 10% to about 90% by weight of the polymeric material that is resistant to 80 wt % 2-butoxyethanol/20 wt % water, based on the total weight of the polymeric materials in the first layer. The first layer includes about 40% to about 85% by weight of the polymeric material that is resistant to 80 wt % diacetone alcohol/20 wt % water and about 15% to about 60% of the other polymeric material that is resistant to 80 wt % 2-butoxyethanol/20 wt % water, based on the total weight of the polymeric materials in the first layer. The polymeric materials typically compose at least about 50 wt %, alternatively, at least about 60 wt %, or at least about 65 wt % of the first layer, based on total weight of the materials in the first layer. Up to about 20 wt % of other polymeric materials may be present in the first layer, based on the total amount of all the polymeric materials in the first layer.

To minimize ablation of the imageable layer during thermal imaging, a photothermal conversion material may be included in the first layer, while the second layer remains substantially free of photothermal conversion material.

Photothermal conversion materials absorb radiation and convert it to heat. Photothermal conversion materials may absorb ultraviolet, visible, and/or infrared radiation. Although the polymeric material may itself include a photothermal conversion material or include an absorbing moiety, typically the photothermal conversion material is a separate compound.

The photothermal conversion material may be either a dye or pigment, such as a dye or pigment of the squarylium, merocyanine, indolizine, pyrylium, or metal diothiolene class. Examples of absorbing pigments are Projet 900, Projet 860 and Projet 830 (all available from the Zeneca Corporation), and carbon black. Dyes, especially dyes with a high extinction coefficient in the range of 750 nm to 1200 nm, are suitable. Absorbing dyes are disclosed in numerous publications, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618. Examples of useful absorbing dyes include, ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors).

In one embodiment, the present invention incorporates an IR dye represented by the formula:

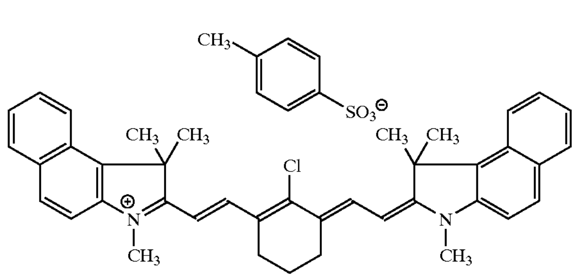

The amount of imaging radiation absorber in the first layer is generally sufficient to provide an optical density of between about 0.05 and 2 at the imaging wavelength. As known to those skilled in the art, the amount of absorber required to produce a particular optical density may be determined from the thickness of the first layer and the extinction coefficient of the absorber at the wavelength used for imaging using Beers Law. Typically, the first layer includes at least about 0.1 wt % percent of imaging radiation absorber, more particularly between about 1 and 30 wt % of absorber.

The first layer may be applied over the hydrophilic surface of the substrate using conventional coating or lamination methods. For example, the first layer may be applied over the hydrophilic surface by dissolving the various ingredients in a suitable solvent, mixing, and then coating onto the surface by spin coating, bar coating, gravure coating or roller coating.

The second layer may include a second polymeric material, an effective amount of a quinonediazide to provide the second layer with substantial insolubility in a developer, and a base. The second polymeric material is ink-receptive and may have a relatively low solubility in an aqueous alkaline solution prior to thermal imaging. Examples of suitable second polymeric materials include polymers containing phenolic hydroxyl groups (i.e. phenolic resins) on the phenolic backbone or pendant groups. Novolac resins, resol resins, acrylic resins containing pendant phenol groups and polyvinyl phenol resins are also suitable. In one embodiment the second polymer is a Novolac resin (Borden Chemical, Columbus, Ohio). In another embodiment, the Novolac resin is an alkylated Novolac resin (Schnectady, Schnectady, N.Y.). Other examples of suitable compounds include, for example, polyhydroxystyrenes and copolymers containing recurring units of a hydroxystyrene, and polymers and copolymers containing recurring units of substituted hydroxystyrenes.

Suitable Novolac resins are commercially available. They are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical Novolac resins include, for example, phenol-formaldehyde resins, cresol-formaldehyde resins, phenol-cresol-formaldehyde resins, p-t-butylphenol-formaldehyde resins, and pyrogallol-acetone resins. Novolac resins prepared by reacting m-cresol, mixtures of m-cresol and p-cresol, or phenol with formaldehyde are particularly useful.

The second layer also includes a solubility inhibitor including an effective amount of a quinonediazide. In one embodiment, the quinonediazide is a naphthoquinonediazide sulfonate ester of phenol formaldehyde (ClarianT GmbH, Wiesbaden, Germany). In a further embodiment, the quinonediazide is a naphthoquinonediazide sulfonate of a cresol Novolac resin (Freundorfer, Munich, Germany). In yet another embodiment, the quinonediazide is a naphthoquinonediazide sulfonate ester of pyrogallol acetone condensate (PCAS, Longjumeau, France).

Other suitable quinonediazides include, but are not limited to: 2,4-bis(2-diazo-1,2-dihydro-1-oxo-5-naphthalenesulfonyloxy)benzophenone; 2-diazo-1,2-dihydro-1-oxo-5-naphthalenesulfonyloxy-2,2-bishydroxyphenylpropane monoester; the hexahydroxybenzophenone hexaester of 2-diazo-1,2-dihydro-1-oxo-5-naphthalenesulfonic acid; 2,2'-bis(2-diazo-1,2-dihydro-1-oxo-5-naphthalenesulfonyloxy)biphenyl; 2,2',4,4'-tetrakis(2-diazo-1,2-dihydro-1-oxo-5-naphthalenesulfonyloxy)biphenyl; 2,3,4-tris(2-diazo-1,2-dihydro-1-oxo-5-naphthalenesulfonyloxy)benzophenone; 2,4-bis(2-diazo-1,2-dihydro-1-oxo-4-naphthalenesulfonyloxy)benzophenone; 2-diazo-1,2-dihydro-1-oxo-4-naphthalenesulfonyloxy-2,2-bishydroxyphenylpropane monoester; the hexahydroxybenzophenone hexaester of 2-diazo-1,2-dihydro-1-oxo-4-naphthalenesulfonic acid; 2,2'-bis(2-diazo-1,2-dihydro-1-oxo-4-naphthalenesulfonyloxy)biphenyl; 2,2',4,4'-tetrakis(2-diazo-1,2-dihydro-1-oxo-4-naphthalenesulfonyloxy)biphenyl; or 2,3,4-tris(2-diazo-1,2-dihydro-1-oxo-4-naphthalenesulfonyloxy)benzophenone. Additional solubility inhibitors include those described in Mizutani, U.S. Pat No. 5,143,816.

Alternatively, or additionally, the second layer may comprise a polymeric diazonaphthoquinone compound. Polymeric diazonaphthoquinone compounds include derivatized resins formed by the reaction of a reactive derivative that contains a diazonaphthoquinone moiety and a polymeric material that contains a suitable reactive group, such as a hydroxyl or amino group. Suitable polymeric materials for forming these derivatized resins include the Novolac resins, resole resins, polyvinyl phenols, acrylate and methacrylate copolymers of hydroxy-containing monomers such as hydroxystyrene. Representative reactive derivatives include sulfonic and carboxylic acid, ester, or amide derivatives of the diazonaphthoquinone moiety. Derivatization of phenolic resins with compounds that contain the diazonaphthoquinone moiety is described, for example, in West, U.S. Pat. Nos. 5,705,308, and 5,705,322. An example of a polymer derivatized with a compound that comprises a diazonaphthoquinone moiety is P-3000, a naphthoquinone diazide of a pyrogallol/acetone resin (available from PCAS, France).

Additional suitable compounds that contain the o-diazonaphthoquinone moiety (i.e., quinonediazides), may include an o-diazonaphthoquinone moiety attached to a ballasting moiety that has a molecular weight of at least 1500, but less than about 5000. These compounds may be prepared by the reaction of a 1,2-naphthoquinone diazide having a halogenosulfonyl group at the 4- or 5-position with a mono- or poly-hydroxyphenyl compound such as mono- or poly-hydroxy benzophenone.

Although phenolic polymers that have been derivatized with groups that contain the diazonaphthoquinone moiety are generally soluble in or removable by an alkaline developer, a layer comprising or consisting essentially of one or more of these materials is "insoluble" or "substantially insoluble" in the developer. This is because "solubility" and "insolubility" of the composite element are determined by the relative rates at which the imaged and unimaged regions of the composite element are removed by the developer. Following image-wise thermal exposure of the composite element having a second layer including one or more of derivatized phenolic polymeric materials, the exposed regions of the second layer are removed by the developer more rapidly than the unexposed regions. If the development step is carried out for an appropriate time, the exposed regions are removed and the unexposed regions remain, so that an image made up of the unexposed regions is formed. Hence, the exposed regions are "removable" or substantially "soluble" in the aqueous developer and the unexposed regions are "not removable" or substantially "insoluble" in the alkaline developer. Therefore, an effective amount of a quinonediazide in the second layer provides the second layer with sufficient insolubility that unimaged portions remain after development in the aqueous alkaline solution.

The second layer also includes a base. Suitable bases include molecular or ionic substances that can combine with a proton to form a new compound, or substances that provide a pair of electrons for a covalent bond with a Lewis acid. Suitable bases include hydroxyl ion, suitable anions, metal oxides and compounds including oxygen, nitrogen and sulfur with non-bonded electron pairs, such as ammonia. Other suitable bases include sodium citrate, 1-hydroxyethyl-2-alkylimidazoline, triethanolamine, triethylamine and/or aminomethyl propanol. The base may provide the second layer with increased insolubility after heating.

The second layer may also comprise a dye to aid in the visual inspection of the exposed and/or developed element. However, when the photothermal conversion material is in the first layer, the second layer should not absorb the imaging radiation, so dyes that absorb the imaging radiation should not be used in the second layer. Printout dyes distinguish the exposed regions from the unexposed regions during processing. Contrast dyes distinguish the unimaged regions from the imaged regions in the developed imageable element. Triarylmethane dyes, such as ethyl violet, crystal violet, malachite green, brilliant green, Victoria blue B, Victoria blue R, and Victoria pure blue BO, may act as a contrast dye.

When the second layer comprises a phenolic polymer that has been derivatized with groups that contain the quinonediazide moiety, the second layer typically includes about 30 wt % to 100 wt % of the derivatized polymer, based on the total dry composition weight of the second layer layer. More typically the second layer includes about 30 wt % of the derivatized polymer and about 68 wt % to 70 wt % of the underivatized polymer, based on the total dry composition weight of the second layer. When the second layer comprises an quinonediazide moiety attached to a ballasting moiety that has a molecular weight of at least 1500 but less than about 5000, the quinonediazide containing compound typically composes about 0.5 wt % to about 30 wt %, preferably about 1 wt % to 15 wt %, based on the total dry composition weight of the second layer. In either case, about 2 wt % of contrast dye, based on the total dry composition weight of the second layer, may be added to make resulting assessment easier.

The second layer is applied over the first layer by conventional coating methods, such as by dissolving the various ingredients in a suitable solvent, mixing the solution, and coating the first layer by spin coating, bar coating, gravure coating or roller coating.

The solvent used to coat each of the layers depends on the nature of the first polymeric material, the photothermal conversion material, and the second polymeric material, as well as the other ingredients present in the layers, if any. To prevent the first layer from dissolving and mixing with the second layer, the coating solvent for the second layer may be a solvent in which the first polymeric material and the other components of the first layer, if any, are essentially insoluble. Typically the first polymeric material will be soluble in more polar solvents and insoluble in less polar solvents so that the solvent used to coat the first layer is more polar than the solvent used to coat the second layer.

The second layer may be coated from diethyl ketone, methyl iso-butyl ketone, methyl iso-butyl ketone/methyl ethyl ketone (about 50:50 by weight), methyl ethyl ketone/toluene/3-ethoxyproprionate (about 50:20:30 by weight), or a similar solvent. The first layer may be coated, for example, from an about 50:40:10 wt % mixture of methyl lactate, diethyl ketone, and water; an about 50:25:15:10 wt % mixture of methyl lactate, diethyl ketone, butyrolactone, and water; an about 15:42.5:42.5 wt % mixture of methyl lactate/methanol/dioxolane; or a similar solvent.

Following coating, the composite element may be dried to remove the coating solvent, either by air drying at room temperature or by heating at about 100° C. for about 1 to 2 minutes.

In one embodiment of the present invention, the thermally imageable composite element described herein may undergo one or more treatments prior to being developed. Prior to these treatments, the composite element described above is generally insoluble in an aqueous alkaline solution, but is extremely white light sensitive. To cure white light sensitivity, the composite element may be exposed to ultraviolet radiation for a desired period of time, for example, between 10 and 90 seconds. The UV exposure may degrade the quinonediazide in the second layer to indene carboxylic acid, which removes the white light desensitivity, however this may result in a second layer that is more soluble in the aqueous alkaline solution than desired. The composite element may then be heated in an oven at between about 100° C. and 200° C. for between about 100 and 1000 seconds. The heat treatment may decarboxylate the indene carboxylic acid to indene, which results in substantial insolubility in the second layer. The decarboxylation mechanism may be enhanced by including a base in the second layer. The base may catalyze the decarboxylation during the heat step. The composite element may then be image-wise exposed to thermal radiation. Image-wise exposure produces an imaged composite element with substantial solubility in imaged portions of the second layer, but substantial insolubility in unimaged portions.

Ultraviolet radiation may be supplied by conventional systems, such as a vacuum frame or step and repeat machine using high intensity pulsed xenon and metal halide lamps. Thermally imageable composite elements of the invention may be imaged with a laser or an array of lasers emitting modulated near infrared or infrared radiation in a wavelength region that is absorbed by the element. Imaging is conveniently carried out with a laser emitting at about 830 nm or at about 1056 nm. Suitable commercially available imaging devices include image setters such as the Creo Trendsetter (CREO, British Columbia, Canada) and the Gerber Crescent 42T (Gerber).

After treatment, the composite element may be developed using a developer. The developer may be any liquid or solution that can penetrate and remove the exposed regions of the imageable layer and the underlying regions of the underlayer, without substantially affecting the complimentary unexposed regions. Useful developers are aqueous solutions having a pH of about 7 or above. More particularly, the developer may have a pH between about 8 and 13.5 or between 12 and 14. One suitable developer is Goldstar Developer, a sodium metasilicate developer having a pH of about 14 supplied by Kodak Polychrome Graphics, Norwalk, Conn. Other suitable developers include PC3000, PC955 and PC9000 also supplied by Kodak Polychrome Graphics. Developers are described for example, in Yamasue, U.S. Pat. No. 4,259,434; Seino, U.S. Pat. No. 4,452,880; Miller, U.S. Pat. No. 5,851,735; Eckler, U.S. Pat. No. 5,998,102; Miro, EB-A-0 732 628; Toyama, GB-A-2, 276,729 (DE-A-4 411 176); and Fiebag, U.S. Pat. No. 6,143,479. The developer may be applied to the composite element in any suitable manner, including by brushing, wiping, rubbing or spraying. In one embodiment, the composite element is developed in a Mercury Mark V Processor supplied by Kodak Polychrome Graphics.

Imaging produces an imaged element, which comprises a latent image of imaged (unexposed) regions and non-imaged (exposed) regions in the second layer. Development of the imaged element to form a lithographic printing plate, or printing form, converts the latent image to an image by removing the exposed regions, revealing the hydrophilic surface of the underlying substrate.

Following development, the lithographic printing plate is typically rinsed with water and dried. Drying may be conveniently carried out by infrared radiators or with hot air. After drying, the lithographic printing plate may be treated with a gumming solution, if desired. A gumming solution comprises one or more water-soluble polymers, for example polyvinyl alcohol, polymethacrylic acid, polymethacrylamide, polyhydroxyethylmethacrylate, polyvinylmethylether, gelatin, and polysaccharide such as dextran, pullulan, cellulose, gum arabic, and alginic acid. A preferred material is gum arabic.

For printing, the lithographic printing plate is mounted on a lithographic printing press. Printing may be carried out by applying a fountain solution and then lithographic ink to the image on the surface of the plate. The fountain solution is taken up by the imaged (exposed) regions, i.e., the surface of the hydrophilic substrate revealed by imaging and development, and the ink is taken up by the unimaged (unexposed) regions. The ink is then transferred to a suitable receiving material (such as cloth, paper, metal, glass or plastic) either directly or indirectly through the use of an intermediate offset printing blanket to provide an impression of the image. The printing plate can be cleaned between impressions, if desired, using conventional cleaning means.

One or more of the above-described steps may be performed during or after delivery of the composite element to a customer. For example, in one embodiment, the UV exposure, heat treatment and thermal imaging steps are performed before delivery to the customer, and the developing step is performed by the customer. In another embodiment, the thermal imaging and developing steps are performed after delivery to the customer. In this manner, a white light desensitized printing plate precursor may be delivered to the customer for completion into a lithographic printing plate.

The above-described method provides thermally imageable composite elements that possesses several favorable characteristics. First, the unexposed portions of the second layer possesses improved developer resistance after the element is exposed to radiation. Second, the image produced by the developer has strong resolution and aging characteristics. Third, the element is white light desensitized, resulting in improved composite element performance in normal light. The following examples illustrate these characteristics in further detail.

EXAMPLE 1

First Layer

The first layer components described in the table below were dissolved in a 15:20:5:60 (w:w) solution of butyrolactone, methyl ethyl ketone, water, 1-methoxypropan-2-ol, and then coated using a wire wound bar onto a plurality of 0.3 gauge, aluminum sheets, which had been electrograined, anodized and treated with a solution of polyvinylphosphonic acid. The formulation concentration was selected to provide a dry film having a coating weight of 2.0 g/m$^2$. The coating was dried at 100° C. for 90 seconds.

The components listed below include Binder A, a 45:35:20 mol percent composition of N-phenylmaleimide, methacrylate, and methacrylic acid, and IR dye A, which is represented by the following structure:

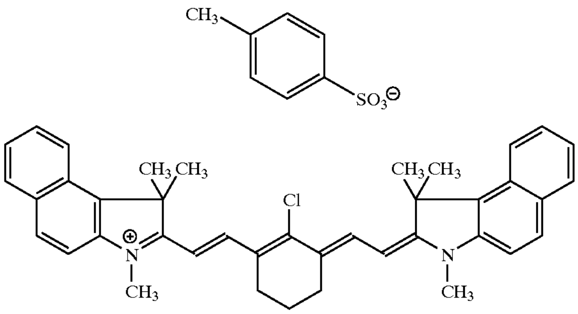

| | Parts By Weight |
|---|---|
| Binder A | 85 |
| IR Dye A | 15 |

Second Layer

The various second layer formulations A through D, composed of the components described below, were each dissolved in a 50:50 (w:w) solution of methyl ethyl ketone and 1-methoxypropan-2-ol. RP2 is a 214 naphthoquinonediazide sulfonate ester of phenol formaldehyde condensate. SD140A is a Novolac resin. HRJ302 is an alkylated Novolac resin. BYK-307 is a polyethoxylated dimethylpolysiloxane copolymer.

The various second layer formulations A through D were then coated onto the plurality of first layer coated aluminum sheets using a wire wound bar. The formulation concentrations (in parts by weight) were selected to provide dry films having coating weights of 0.7 g/m$^2$. The coatings were dried at 100° C. for 90 seconds.

| | Formulations | | | |
|---|---|---|---|---|
| | A | B | C | D |
| Components | Parts/weight | | | |
| RP2 | 97.5 | 95.5 | 30 | 92.5 |
| Sodium Citrate | | 2 | 5 | 5 |
| SD140A | | | 52.5 | |
| HRJ302 | | | 10 | |
| Ethyl Violet | 2 | 2 | 2 | 2 |
| BYK-307 (10% | 0.5 | 0.5 | 0.5 | 0.5 |

In a first experiment, a drop test was performed with Goldstar developer on composite elements including second layer formulations A through D and recorded below (in seconds). In a drop test, a large drop of developer is placed upon each imageable composite element at 22° C., and the time required for the developer to remove the layers is recorded.

In a second experiment, composite elements including the second layer formulations A–D were exposed to a UV flood for 60 seconds. A drop test was then performed, the result of which is recorded below.

In a third experiment, composite elements including the second layer formulations A–D were exposed to UV light for 60 seconds and then heated in a Mathis Labdryer oven for 10 minutes at 160° C. A drop test was performed on the ink-receptive area of each composite element, the result of which is recorded below.

In a fourth experiment, composite elements including the second layer formulations A–D were exposed to UV light for 60 seconds, heated in a Mathis Labdryer oven for 10 minutes at 160° C. and then exposed to 24 hours of white light in a fluorescent strip light room. A drop test was performed on the ink-receptive area of each composite element, the result of which is recorded below.

The table indicates the drop test results (in seconds) for each formulation for each experiment.

| | Formulation | | | |
|---|---|---|---|---|
| | A | B | C | D |
| Experiment | Seconds | | | |
| 1 | 90 | 90 | 120 | 60 |
| 2 | 10 | 10 | 10 | 10 |
| 3 | 90 | 150 | 240 | 120 |
| 4 | 45 | 150 | 240 | 120 |

The experiments indicate several characteristics of the present invention. First, the presence of a base in the formulation provides improved second layer resistance to developer after UV flood and heat treatment. Second, experiment 4 demonstrates that UV flood and heating provide a composite element that is white light desensitized. Third, a composite element including formulation C was UV exposed and heat treated as described above, and was then thermally image-wise exposed on a Trendsetter at 120 $mJ/cm^2$ using an internal test pattern, and developed in a Mercury Mark V processor containing Goldstar developer at a processing speed of 750 mm/min and a developer temperature of 22.5° C. The thermally exposed portions of the coating were dissolved away, leaving an accurate copy of the test pattern.

EXAMPLE 2

In a first experiment, a drop test was performed on composite elements including second layer formulations A–D described above. In a second experiment composite elements including formulation A–D were exposed to a UV flood for 60 seconds and then heat treated in a Mathis Labdryer oven at 110° C. for 120 seconds. A drop test was then performed with Goldstar Developer. In a third experiment, the same procedure was followed except that the composite elements were heat treated for 600 seconds. In a fourth experiment, the elements were heat treated at 160° C. for 120 seconds. In a fifth experiment, the elements were heat treated at 160° C. for 600 seconds. In a sixth experiment, the elements were heat treated at 180° C. for 120 seconds. In a seventh experiment, the elements were heat treated at 180° C. for 600 seconds. The drop test results of all of these experiments are recorded below.

| | Formulation | | | |
|---|---|---|---|---|
| | A | B | C | D |
| Experiment | Seconds | | | |
| 1 | 90 | 90 | 120 | 60 |
| 2 | 10 | 30 | 60 | 30 |
| 3 | 30 | 120 | 180 | 60 |
| 4 | 60 | 90 | 180 | 60 |
| 5 | 90 | 150 | 240 | 120 |
| 6 | 90 | 90 | 180 | 120 |
| 7 | 90 | 120 | 300 | 120 |

As Example 2 illustrates, the relative temperature and time window of heat treatment affects the solubility of the composite elements in the Goldstar developer.

EXAMPLE 3

First Layer

The first layer described in Example 1 was coated using a wire wound bar onto a plurality of 0.3 gauge, aluminum sheets, which had been electrograined, anodized and treated with a solution of polyvinylphosphonic acid. The formulation concentration was selected to provide a dry film having a coating weight of 2.0 $g/m^2$. The coating was dried at 100° C. for 90 seconds.

Second Layer

The various second layer formulations G through L, composed of the components described in the table below, were each dissolved in a 50:50 (w:w) solution of methyl ethyl ketone and 1-methoxypropan-2-ol. P3000 is a 215 naphthoquinonediazide sulfonate ester of pyrogallol acetone condensate. NW744 is a 214 naphthoquinonediazide sulfonate ester of a cresol Novolac resin. The various second layer formulations G through L were then coated onto the plurality of first layer coated aluminum sheets using a wire wound bar. The formulation concentrations (in parts by weight) were selected to provide dry films having coating weights of 0.7 $g/m^2$. The coatings were dried at 100° C. for 90 seconds.

| | Formulations | | | | | |
|---|---|---|---|---|---|---|
| | G | H | I | J | K | L |
| Components | Parts/weight | | | | | |
| P3000 | 97.5 | 30 | 92.5 | | | |
| NW744 | | | | 97.5 | 30 | 92.5 |
| Sodium Citrate | | 5 | 5 | | 5 | 5 |

-continued

| | Formulations | | | | | |
|---|---|---|---|---|---|---|
| | G | H | I | J | K | L |
| Components | Parts/weight | | | | | |
| SD140A | | 52.5 | | | 52.5 | |
| HRJ302 | | 10 | | | 10 | |
| Ethyl Violet | 2 | 2 | 2 | 2 | 2 | 2 |
| BYK-307 (10% w/w in MEK) | 0.5 | 0.5 | 0.5 | 0.5 | 0.5 | 0.5 |

In a first experiment, composite elements including formulations G through L were subjected to a drop test using Goldstar developer. In a second experiment composite elements including formulations G through L were exposed to a UV flood for 60 seconds. A drop test was then performed with Goldstar. In a third experiment, composite elements including formulations G through L were UV flood exposed for 60 second and heat treated for 10 minutes at 160° C. A drop test was then performed with Goldstar. In a fourth experiment, experiment 3 was followed except that after heat treatment, the composite elements were exposed to white light for 24 hours. A drop test was then performed. The results of the drop tests are recorded below.

| | Formulation | | | | | |
|---|---|---|---|---|---|---|
| | G | H | I | J | K | L |
| Experiment | Seconds | | | | | |
| 1 | 120 | 120 | 90 | 180 | 150 | 180 |
| 2 | 10 | 10 | 10 | 10 | 10 | 10 |
| 3 | 90 | 480 | 240 | 210 | 300 | 420 |
| 4 | 45 | 480 | 240 | 60 | 300 | 420 |

This example illustrates that a variety of NQD containing phenolic resins are suitable for the present invention. It also demonstrates that the UV flood and heat treatment steps produce a white light stable plate. Further, a plurality of elements containing layer formulations G–L were imagewise exposed and developed as described in Example 1. The thermally exposed regions dissolved away, leaving accurate copies of the imaging test pattern.

EXAMPLE 4

First Layer

The first layer described in Example 1 was coated using a wire wound bar onto a plurality of 0.3 gauge, aluminum sheets, which had been electrograined, anodized and treated with a solution of polyvinylphosphonic acid. The formulation concentration was selected to provide a dry film having a coating weight of 2.0 g/m$^2$. The coating was dried at 100° C. for 90 seconds.

Second Layer

The various second layer formulations M through O, composed of the components described below, were each dissolved in a 50:50 (w:w) solution of methyl ethyl ketone and 1-methoxypropan-2-ol. The various second layer formulations M through O were then coated onto the plurality of first layer coated sheets using a wire wound bar. The formulation concentrations (in parts by weight) were selected to provide dry films having coating weights of 0.7 g/m$^2$. The coatings were dried at 100° C. for 90 seconds.

| | Formulations | | |
|---|---|---|---|
| | M | N | O |
| Components | Parts/weight | | |
| P3000 | 30 | | |
| RP2 | | 30 | |
| NW744 | | | 30 |
| Sodium Citrate | 5 | 5 | 5 |
| SD140A | 52.5 | 52.5 | 52.5 |
| HRJ302 | 10 | 10 | 10 |
| Ethyl Violet | 2 | 2 | 2 |
| BYK-307 (10% w/w | 0.5 | 0.5 | 0.5 |

In a first experiment, composite elements having second layer formulations M–O were UV exposed for 30 seconds and then a drop test was performed. In a second experiment, composite elements having formulations M–O were UV exposed for 15 seconds and then a drop test was performed. In a third experiment, composite elements including formulations M–O were UV exposed for 30 seconds and then heat treated for 10 minutes at 160° C. A drop test was then performed. In a fourth experiment, composite elements including formulations M–O were UV exposed for 15 seconds and then heat treated for 10 minutes at 160° C. A drop test was then performed. The results of the drop test are recorded below.

| | Formulation | | |
|---|---|---|---|
| | M | N | O |
| Experiment | Seconds | | |
| 1 | 10 | 10 | 10 |
| 2 | 10 | 10 | 10 |
| 3 | 480 | 240 | 300 |
| 4 | 480 | 240 | 300 |

This example demonstrates that 15 seconds of UV exposure is sufficient for the present invention.

EXAMPLE 5

First Layer

The first layer as described in Example 1 was coated using a wire wound bar onto a plurality of 0.3 gauge, aluminum sheets, which had been electrograined, anodized and treated with a solution of polyvinylphosphonic acid. The formulation concentration was selected to provide a dry film having a coating weight of 2.0 g/m$^2$. The coating was dried at 100° C. for 90 seconds.

Second Layer

The various second layer formulations P through Z, composed of the components described below, were each dissolved in a 50:50 (w:w) solution of methyl ethyl ketone and 1-methoxypropan-2-ol. The various second layer formulations A through F were then coated onto the plurality of first layer coated aluminum sheets using a wire wound bar. The formulation concentrations (in parts by weight) were selected to provide dry films having coating weights of 0.7 g/m$^2$. The coatings were dried at 100° C. for 90 seconds.

| Components | Formulations P | Q | R | S | T | U | V | W | X | Y | Z |
|---|---|---|---|---|---|---|---|---|---|---|---|
| | Parts/weight | | | | | | | | | | |
| P3000 | 30 | 30 | 30 | 30 | 30 | 30 | 30 | 30 | 30 | 30 | 30 |
| Sodium Citrate | | 5 | | | | 10 | | | | 2 | |
| Monazoline C | | | 5 | | | | 10 | | | | |
| Triethanolamine | | | | 5 | | | | 10 | | | 2 |
| Aminomethyl | | | | | 5 | | | | 10 | | |
| SD140A | 57.5 | 52.5 | 52.5 | 52.5 | 52.5 | 47.5 | 47.5 | 47.5 | 47.5 | 55.5 | 55.5 |
| HRJ302 | 10 | 10 | 10 | 10 | 10 | 10 | 10 | 10 | 10 | 10 | 10 |
| Ethyl Violet | 2 | 2 | 2 | 2 | 2 | 2 | 2 | 2 | 2 | 2 | 2 |
| BYK-307 (10% w/w in MEK) | 0.5 | 0.5 | 0.5 | 0.5 | 0.5 | 0.5 | 0.5 | 0.5 | 0.5 | 0.5 | 0.5 |

In a first experiment, a plurality of the composite elements having layer formulations P–Z were UV exposed for 60 seconds, heat treated for 10 minutes at 160° C. and a drop test was then performed with Goldstar. The result is recorded below.

| Experiment | Formulations P | Q | R | S | T | U | V | W | X | Y | Z |
|---|---|---|---|---|---|---|---|---|---|---|---|
| 1 | 90 | 480 | 300 | 180 | 210 | 330 | 300 | 180 | 180 | 90 | 90 |

Example 5 illustrates that several different based may be suitable for the present invention. Additionally, a suitable base level may range from 2% to 10% of the dry film.

Although the present invention has been described with reference to several embodiments, workers skilled in the art will recognize that changes may be made in form and detail without departing from the spirit and scope of the invention. In addition, the invention is not to be taken as limited to all of the above described details as modifications and variations thereof may be made without departing from the spirit or scope of the invention.

What is claimed is:

1. A method of forming a printing plate precursor comprising:

(a) exposing a printing plate precursor to ultraviolet light to form a white light-desensitized printing plate precursor, the printing plate precursor comprising:

(1) a substrate having a hydrophilic surface, (2) a first layer applied to the substrate which is soluble in an aqueous alkaline solution, and (3) a second layer applied to the first layer including a polymeric material, a base, and an effective amount of a quinonediazide to provide the second layer with substantial insolubility in an aqueous alkaline solution; and (b) heating the ultraviolet light exposed precursor to form a positive-working imageable printing plate precursor.

2. The method of claim 1 wherein the quinonediazide consists of naphthoquinonediazide.

3. The method of claim 1 wherein the effective amount of quinonediazide is between 15 and 45 parts by weight of the second layer.

4. The method of claim 1 wherein the quinonediazide consists of a naphthoquinonediazide sulfonate ester of a cresol Novolac.

5. The method of claim 1 wherein the polymeric material includes a Novolac resin.

6. The method of claim 1 wherein the polymeric material includes an alkylated Novolac resin.

7. The method of claim 1 wherein the base includes sodium citrate, triethylamine, triethanolamine, aminomethylpropanol or 1-hyoxyethyl-2-alkylimideazoline.

8. The method of claim 1 wherein exposing the prescursor to ultraviolet light comprises exposing the prescursor to ultraviolet light for at least 10 seconds.

9. The method of claim 1 wherein exposing the prescursor to ultraviolet light comprises exposing the prescursor to ultraviolet light for at least 15 seconds.

10. The method of claim 1 wherein exposing the prescursor to ultraviolet light comprises exposing the prescursor to ultraviolet light for at least 30 seconds.

11. The method of claim 1 wherein exposing the prescursor to ultraviolet light comprises exposing the prescursor to ultraviolet light for at least 60 seconds.

12. The method of claim 1 wherein the hydrophilic substrate is an aluminum sheet.

13. The method of claim 1 wherein the first layer includes a binder soluble in an aqueous alkaline developer.

14. The method of claim 13 wherein the binder includes a polymeric material.

15. The method of claim 13 wherein the binder is a copolymer of N-phenylmaleimide, methacrylamide, and methacrylic acid.

16. The method of claim 1 wherein the first layer includes an infrared absorber.

17. The method of claim 1 wherein the first layer includes an infrared dye.

18. The method of claim 17 wherein the dye is represented by the structure:

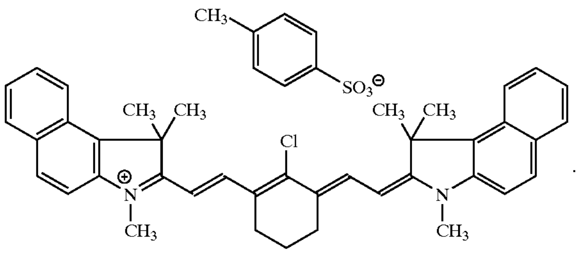

19. The method of claim 1 wherein heating the precursor consists of heating the precursor in an oven at between about 100° C. and 200° C. for between about 100 seconds and 1000 seconds.

20. The method of claim 1 further comprising thermally imagewise exposing the heated precursor.

21. A method of forming a image on a printing plate precursor comprising:

(a) providing a printing plate precursor comprising:
(1) a substrate having a hydrophilic surface,
(2) a first layer applied to the substrate which is soluble in an aqueous alkaline solution, and
(3) a second layer applied to the first layer and including an effective amount of a quinonediazide to provide the second layer with substantial insolubility in an aqueous alkaline solution;

(b) exposing the precursor to ultraviolet light to form a white-light desensitized printing plate precursor;

(c) heating the ultraviolet light exposed precursor to form a positive-working imageable printing plate precursor;

(d) thermally imagewise exposing the heated precursor; and (e) developing thermally imagewise exposed portions of the precursor with the aqueous alkaline solution to form a developer-resistant image.

22. The method of claim 21 wherein the aqueous alkaline solution has a pH between about 7 and 14.

23. The method of claim 21 wherein the aqueous alkaline solution has a pH of about 14.

24. The method of claim 21 wherein developing the precursor with the aqueous alkaline solution includes developing the precursor with a sodium metasilicate developer.

25. A method of forming a printing plate precursor comprising:

delivering a printing plate precursor to a customer, the precursor including:
(1) a substrate having a hydrophilic surface,
(2) a first layer applied to the substrate which is soluble in an aqueous alkaline solution, and
(3) a second layer applied to the first layer and including an effective amount of a quinonediazide to provide the second layer with substantial insolubility in an aqueous alkaline solution, wherein the precursor is exposed to ultraviolet light prior to delivery;

exposing the precursor to ultraviolet light prior to delivery to form a white light-desensitized printing plate precursor; and heating the ultraviolet light exposed precursor prior to, during or after delivery to form a positive working printing plate precursor.

26. The method of claim 25 further comprising thermally imagewise exposing the heated precursor.

27. The method of claim 26 wherein thermally imagewise exposing the precursor consists of infrared image-wise exposing the precursor.

28. The method of claim 26 wherein thermally imagewise exposing the precursor consists of thermally imagewise exposing the precursor to radiation having a wavelength between about 800 and 1200 nm.

29. The method of claim 26, further comprising the step of developing the thermally imagewise exposed precursor to form a printing plate.

* * * * *

UNITED STATES PATENT AND TRADEMARK OFFICE

CERTIFICATE OF CORRECTION

PATENT NO. : 6,849,372 B2 
DATED : February 1, 2005
INVENTOR(S) : Kevin Barry Ray et al.

It is certified that error appears in the above-identified patent and that said Letters Patent is hereby corrected as shown below:

Column 18,
Line 39, delete "1-hyoxyethyl-2-alkylimideazoline" and insert therefor
-- 1-hydroxyethyl-2-alkylimideazoline --
Lines 40, 41, 43, 44, 48, 49 and 50, delete "prescursor" and insert therefor -- precursor --

Signed and Sealed this

Seventeenth Day of May, 2005

JON W. DUDAS
*Director of the United States Patent and Trademark Office*